Aug. 4, 1970 L. N. CHELLIS 3,523,037
EPOXY RESIN COMPOSITION CONTAINING BROMINATED POLYGLYCIDYL ETHER OF BISPHENOL A AND A POLYGLYCIDYL ETHER OF TETRAKIS (HYDROXYPHENYL) ETHANE
Filed June 12, 1967
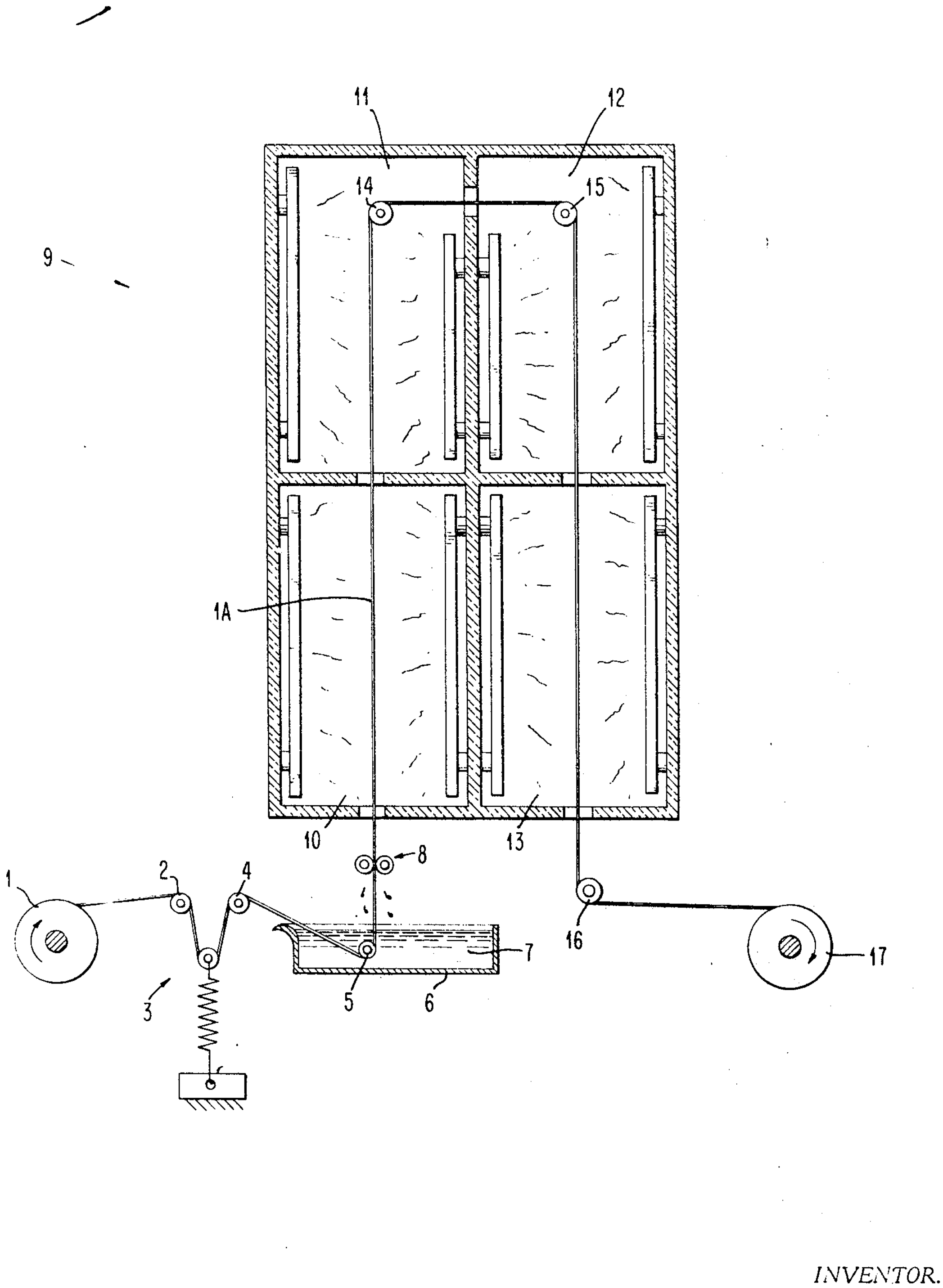
INVENTOR.
LEROY N. CHELLIS
BY Hansel L. McGee
ATTORNEY United States Patent Office 3,523,037
Patented Aug. 4, 1970

3,523,037

EPOXY RESIN COMPOSITION CONTAINING BROMINATED POLYGLYCIDYL ETHER OF BISPHENOL A AND A POLYGLYCIDYL ETHER OF TETRAKIS(HYDROXYPHENYL) ETHANE

Leroy N. Chellis, Endwell, N.Y., assignor to International Business Machines Corporation, Armonk, N.Y., a corporation of New York Filed June 12, 1967, Ser. No. 645,314
Int. Cl. B44d *1/48;* B32b *27/38*
U.S. Cl. 117—119.6 5 Claims

ABSTRACT OF THE DISCLOSURE

An epoxy resin system comprising a tetrafunctional epoxy resin, having an average functionality of about 4, an epoxy resin have a functionality of about 2, a curing agent and a tertiary amine in suitable solvent is provided. The epoxy resin system is used to impregnate glass fabrics from which multilayer laminates are prepared for use as printed circuit boards. The epoxy resin system contains 70–90 parts of brominated polyglycidyl ether of bisphenol A and 10–30 parts of tetrakis(hydroxyphenyl) ethane tetraglycidyl ether cured with 3 to 4 parts of dicyandiamide, and 0.2 to 0.4 part of a tertiary amine, all parts being parts by weight per 100 parts of resin solids.

FIELD OF THE INVENTION

This invention relates to epoxy resin compositions; more specifically it relates to epoxy resin compositions comprising an epoxy resin component with a high functionality and a second epoxy resin component having a low functionality, and to an improved method of preparing multilayered laminates which are prepared from glass fabrics impregnated with the epoxy resin compositions of said invention.

DESCRIPTION OF THE PRIOR ART

Laminates of epoxy resin impregnated glass fabrics are used in the preparation of printed circuit boards. These laminates are required to be solvent resistant, since they are repeatedly exposed to processing solvents and their vapors. For example, photoresists are stripped from the surface of metal, bonded to the surface of the laminate, by exposing the photoresist to halogenated hydrocarbons. During this process, resin leaching and softening of the laminate often occurs on commercially available laminates.

The laminates are also required to be self-extinguishing, i.e., the epoxy impregnant must be a fire retardant. Further, they should not be easily distorated by heat, i.e., they should have a high heat distortion temperature to avoid warpage, when exposed to high process temperatures. Peeling of a metal film from the laminate's surface presents a major problem in printed circuit board manufacture. Thus, as an additional requirement, the epoxy resin impregnant should have sufficient adhesive powers to strongly bond the metal film to the laminate's surface.

Still another problem in the manufacture of multilayer printed circuit boards is that of epoxy resin smear in drilled holes. Multilayer circuit boards contain internal planes which of necessity must be electrically connected to outer layers of circuitry by means of plated through holes. These holes are dlriled in the multilayer boards by high speed drills which generate heat due to the abrasive nature of the glass fibers. Electrical continuity is established by plating through the holes using known electroless copper and/or electroplated copper techniques. If the epoxy resin is not properly cross-linked and therefore has a low heat distortion point, it tends to be "smeared" and deposited on the edge of the copper internal planes exposed by drilling. This smear of epoxy resin subsequently interferes with electrical contact between the internal plane and the plated copper in the hole.

The art has attempted to overcome the above problems through the use of many epoxy resin formulations. While several of the problems have been solved individually, they have not yet been solved as a unit. For example, one attempt at solving the above problems has been made through the use of an unmodified bromintaed epoxy resin, e.g., the diglycidyl ether of tetrabromo bisphenol A, cured with dicyandiamide and a tertiary amine. Laminates prepared from prepregs, i.e., (partially cured epoxy resin impregnated glass fabrics) with this epoxy resin system require extensive postcuring, e.g. baking for up to 120 minutes at 375° F. to promote as complete cross-linking as is possible with this unmodified resin. This extensive post-curing results in excessive warpage of multilayer laminates. (These laminates exhibit only marginal improvement in solvent resistance.)

Resin systems based on brominated epoxy resins and diamino diphenyl sulfone, accelerated with a Lewis acid have also been used as the impregnant. The major shortcomings of this system are that it requires an elevated temperature post-cure, i.e., 2 to 3 hours at about 392° F. in order to develop the desired physical, thermal, and chemical resistance properties. This results in warpage and dimensional instability problems. Added disadvantages of this system are that electrical properties are degraded by the presence of the Lewis acid type accelerators, and room temperature stability of the prepregs is marginal, i.e., the prepregs can be stored for about 3 months.

Epoxy resin-acid anhydride systems, using nadic methyl, trimellitic, dodecenyl succinic and hexahydrophthalic anhydrides et al., have also been used. Prepregs prepared with these materials are unstable, i.e., continue to advance in cure at room temperature and even under refrigeration. Additionally, the uncured resin system is highly susceptible to absorption of water, thus controlled low humidity storage and laminating environments are necessary. Metal adhesion to the prepreg laminate surface is also poor.

Another resin system comprising epoxidized novolac resins (polyhydroxyphenols), brominated epoxy resin, dicyandiamide and a tertiary amine has also been used. The novolac resin has an average functionality of 3.3, i.e., an average of 3.3 epoxy groups per molecule. These resins, because of a relatively high functionality, are known to produce tightly cross-linked cure systems with better elevated temperature performance and solvent resistance than bisphenol A based resins whose functionality can be no greater than 2. However, the laminates prepared from this system display poor metal adhesion and are difficult to machine. Additionally, tests established that 20–30 parts of epoxy-novolac only marginally improved solvent resistance.

SUMMARY OF THE INVENTION

To overcome the problems of the prior art, this invention provides a unique epoxy resin system for use in the preparation of pregregs. Basically, the epoxy resin system of this invention is comprised of an epoxy resin having a high functionality, i.e., of from 3.5 to 6, a second epoxy resin having a low functionality, i.e., of from 1.7 to 2, a curing agent and a tertiary amine as a curing catalyst. The second epoxy resin may be halogenated or non-halogenated. Additionally, there is provided an improved method of preparing prepregs characterized by impregnating glass fabrics with the above epoxy resin system. The prepregs have a high functionality epoxy resin content of from about 10 to 25 parts per hundred by weight.

OBJECTS

It is an object of this invention to provide an improved epoxy resin composition for impregnating glass fabrics, which impregnated glass fabrics are laminated to form printed circuit boards.

Another object of this invention is to provide an improved epoxy composition for impregnating glass fabrics wherein said epoxy resin composition comprises an epoxy resin having a high functionality, an epoxy resin having a lower functionality, a curing agent and a tertiary amine as a catalyst.

Still another object of this invention is the provision of a method of preparing prepregs which are solvent resistant, have a high heat of distortion temperature, are self-extinguishing, provide a strongly adhesive surface for bonding a metal thereto and are stable in their uncured or partially cured state.

The foregoing and other objects, features and advantages of this invention will be apparent from the following more particular description of the preferred embodiments of the invention, as illustrated in the accompanying drawing and example.

BRIEF DESCRIPTION OF THE DRAWING

FIG. 1, the only drawing in the case is directed to an apparatus for impregnating a glass fabric with an epoxy resin composition and for partially curing the epoxy resin impregnated fabric.

DESCRIPTION OF THE PREFERRED EMBODIMENTS

According to one aspect of the invention, there is provided an epoxy resin composition comprising:

A brominated epoxy resin—70 to 90 parts per hundred by weight of resin solids
A tetrafunctional epoxy resin—10 to 30 parts per hundred by weight of resin solids
Dicyandiamide—3 to 4 parts per hundred by weight
Tertiary amine—0.2 to 0.4 part per hundred by weight
Ethylene glycol monomethyl ether (methyl Cellosolve)—40 parts by weight
Methyl ethyl ketone in amounts necessary to impart a specific gravity of about 1.085±.005 to the composition.

The brominated epoxy resin is based on polyglycidyl ether of tetrabromo bisphenol A and is prepared from tetrabromo bisphenol A and epichlorhydrin. It has a functionality of about 2, an epoxide equivalent weight about 455 to 500 and a bromine content of about 19% to 23% by weight. It is supplied by the Ciba Products Co. under the trade name Araldite 8011, as a solution containing 75 percent epoxy resin by weight in methyl ethyl ketone or by Dow Chemical Co. under the trade name DER–511, as an 80% solution in methyl ethyl ketone.

The tetrafunctional epoxy resin is the polyglycidyl ethers of tetraphenylene and is prepared from tetra bis (hydroxyphenyl) ethane and epichlorhydrin. The epoxy resin has an average functionality of about 4 and an epoxide equivalent weight of about 210 to 240. It is supplied by the Shell Chemical Corp. under the trade name Epon 1031 as a solution containing 80% solids by weight in methyl ethyl ketone or by Union Carbide Co. under the trade name Bakelite ERR–0153.

Dicyandiamide (cyanoquanidine) is the preferred curing agent in this epoxy resin system of the invention. Its curing rate is catalyzed by the tertiary amines, which may be selected from benzyldimethylamine, α-methylbenzyldimethylamine, dimethylaminomethylphenol, tris (dimethylaminomethylphenol); and although dicyandiamide is the preferred curing agent, other known curing agents can also be used. For example, anhydrides such as chlorendic anhydrides, nadic anhydride, methyl, trimellitic anhydrides among others are also used. Amines and carboxylic acids as well as other known curing agents are also used. Preferably, N,N,N′,N′ - tetramethyl - 1,3-butane diamine is used as the catalyst.

Ethylene glycol monomethyl ether and methyl ethyl ketone serves as the preferred solvents to give the composition a preferred consistency and to maintain the specific gravity of the composition at about 1.085±0.005. While ethylene glycol monomethyl ether and methyl ethyl ketone are the solvents of choice, other, suitable solvents may also be used. For example, acetone or acetone and water may be used. Additionally, methyl ethyl ketone-dimethyl formamide can be used advantageously. Other suitable solvents in which the resin, curing agent and catalyst are soluble can be used and are easily determinable by those skilled in the art.

In order that those skilled in the art may better understand how the present invention may be practiced, the following example is given by way of illustration and not by way of limitation. All parts and percents are by weight unless otherwise noted.

Example 1

The above epoxy resin composition is compounded as follows:

40 parts of ethylene glycol monomethyl ether is placed in a jacketed vessel equipped with a propeller type stirrer. This solvent is heated to 110° F.±15° F. with agitation by circulating hot water through the jacket of the mixing vessel. When the solvent reaches a temperature of about 100° F., four parts of dicyandiamide are added thereto. Agitation is continued for 15 to 20 minutes to completely dissolve the dicyandiamide. When said dicyandiamide has been dissolved, the solution is cooled to room temperature.

In a separate mixing tank, 12.5 parts of an 80% polyglycidyl ether of tetraphenylene solution is added to 120 parts of a 75% polyglycidyl ether of tetrabromo bisphenol A solution and is agitated. The dicyandiamide-glycol monomethyl ether solution is then added to the epoxy resin solution with stirring. The resulting solution is adjusted to a specific gravity of 1.085±.005, e.g., by the addition of methyl ethyl ketone to the above solution.

The resulting epoxy resin composition may be stored for about 3 days or it can be used immediately to impregnate a glass fabric. When the epoxy resin composition is ready to be used to impregnate the glass fabric 0.2 to 0.4 part of N,N,N′,N′-tetramethyl-1,3-butane diamine is added with stirring thereto 4 to 6 hours prior to the impregnation operation.

The impregnating operation is performed according to FIG. 1. A roll of woven glass fabric 1, commonly 2 mils to 10 mils in thickness, is threaded over guide roll 2, under a tension roll 3 and over a second guide roll 4. A third guide roll 5 directs the web of fabric into a pan 6 containing the above epoxy resin solution 7 where the fabric 1A is impregnated with the same. After being impregnated, the fabric 1A passes through a pair of doctor rolls 8 where excess epoxy resin solution is removed from the surfaces of the web 1 and dropped back into pan 6. The amount of resin solution weight pickup can be varied by moving the rolls 8 toward or away from the web by a few tenths of a mil. The web 1A then passes into an oven, generally designated as 9. The oven is comprised of four individual chambers 10, 11, 12 and 13, each chamber being heated separately and at different temperatures. Each chamber also contains a blower (not shown) to circulate hot air over the surfaces of the web 1A. The chambers 10 and 11 are heated to provide a temperature gradient of from 250° F. to 320° F. so that as the web 1A passes therethrough, the solvents, methyl ethyl ketone and methyl Cellosolve, are removed from said web 1A, leaving only the resinous material behind.

Chambers 12 and 13 are heated so that a temperature gradient of from 300° F. to 350° F. is maintained. As the web 1A passes over turn around rolls (14 and 15) and pass through these chambers (12 and 13), the epoxy resin residue is polymerized to a desired state of partial cure. This state of curing is obtained by determining resin flow when a predetermined number of sheets of the impregnated fabric (prepreg) are pressed at a temperature of 340±5° F. and 300 p.s.i. for 3 minutes. Web 1A then passes out of the oven 9 to web drive 16 and finally onto a driven, variable-speed windup roll 17. Wind-up roll 17 allows one to control the speed and tension of the fabric going through the oven.

The now impregnated fabric or prepreg is divided into sheets of a desired size in preparation for lamination to form the printed circuit board. The number of sheets of prepreg in any given laminate depends on the thickness and weight per unit area of the original glass fabric, the ratio of resin to glass in the prepreg, laminating pressure among other factors. The number of sheets may vary from one to twenty or more depending upon the above factors.

Typically, to prepare a 40 mil thick printed circuit laminate, one uses a 4 mil glass fabric containing 45%–55% epoxy resin by weight, i.e., each square yard of fabric weighing 3 ounces will contain from 2.46 to 3.66 ounces of resin after solvent has been removed. The resin content of said laminate includes from 10 to 30 parts of the tetrafunctional resin per hundred by weight of the resin content of said article. Resin flow is typically 10% to 30%.

Sheets, e.g., 8 sheets, of the prepreg are interleaved between sheets of electrolytic copper foil and placed between two polished metal plates. This assembly of prepregs and metal plates and copper foils is then placed between platens of a laminating press. The platens are cored for steam or superheated water so that they can be heated to a temperature of 350° or more. The above assembly is subjected to pressure which may vary from 50 p.s.i. to 2,000 p.s.i., depending upon resin content, flow of the prepreg, and laminating temperatures. For example, a printed circuit laminate having 50% resin content and 20% nominal flow may be laminated at 400 p.s.i. and 340° F. platen temperature. The laminate is maintained at this temperature and pressure for a time sufficient to cause flow of the resin and completes the curing of the resin to a degree where it will provide properties desired in the laminate. Typical cure times vary from 30 minutes to 120 minutes at 340° F.

Laminates containing unmodified brominated epoxy resin, i.e., containing only the brominated epoxy resin, were prepared and tested before and after post-baking for 2 hours at 375° F. to determine their solvent resistance. A similar test was made on laminates prepared from the epoxy resin composition of this invention. The laminates, 4.0 mils in thickness, were exposed for 2 minutes to trichloroethylene vapors at 190° F. The unmodified brominated resin laminates showed surface softening and absorbed solvent as determined by weight increase. The brominated resin modified with the tetrafunctional resins, i.e., the composition of this invention, were found to be superior. For example, unmodified brominated resin laminates exhibited a weight increase of about 5% to 6%, while the tetrafunctional modified laminates showed a weight increase of only 1% to 2%.

What has been described here is an improved epoxy resin system for use in preparing printed circuit laminates and a method of preparing the same. The laminates prepared with the composition of this invention have been proven to be superior to laminates prepared from epoxy compositions of the prior art. For example, the laminates of this invention exhibit increased solvent resistance, are self-extinguishing, strongly bond copper to their surface, have a high heat distortion temperature and the partially cured prepregs are stable, i.e., can be stored for periods of a year or more without significant advancement of curing and resultant loss of flow. Additionally, substantially no smearing was exhibited when through holes were drilled into the laminates.

While the invention has been particularly shown and described with reference to preferred embodiments thereof, it will be understood by those skilled in the art that various changes in form and details may be made therein without departing from the spirit and scope of the invention.

What is claimed is:

1. An epoxy resin composition for preparing prepregs having improved solvent resistance, high heat distortion temperatures, is self-extinguishing, stable when partially cured and provides a strong, adhesive surface for bonding metals thereto, comprising;

a brominated epoxy resin prepared as the reaction product of tetrabromo bisphenol A and epichlorhydrin, said brominated epoxy resin having a functionality of about 1.7 to about 2, an epoxide equivalent of about 455 to about 500 and a bromine content of about 19% to about 23% by weight of the resin, said brominated epoxy resin being present in the amount of about 70 to about 90 parts per hundred by weight of resin solids;

a tetrafunctional epoxy resin prepared as the reaction product of tetra bis (hydroxyphenyl) ethane and epichlorhydrin, said tetrafunctional epoxy resins having an average functionality of about 4, an epoxide equivalent weight of about 210 to about 240, and is present in the amount of about 10 to about 30 parts per hundred by weight of resin solids;

dicyandiamide as a curing agent and being present in the amount of about 3 to about 4 parts per hundred by weight of resin solids;

a tertiary amine as a catalyst in the amount of about 0.2 to about 0.4 part per hundred by weight of resin solids; and a suitable solvent.

2. The composition of claim 1 wherein said composition is about 10 to 30 parts per hundred by weight of said tetrafunctional epoxy compound, from 70 to 90 parts per hundred by weight of said brominated epoxy resin, 4 parts per hundred by weight of said dicyandiamide, from 0.2 to 0.4 part per hundred by weight of said tertiary amine curing agent, 40 parts by weight of ethylene glycol monomethyl ether and methyl ethyl ketone in amounts sufficient to maintain said composition at a specific gravity of 1.085±.005.

3. A method of preparing prepregs having improved solvent resistance, a high heat distortion temperature, is self-extinguishing and is stable in a partially cured condition, comprising the steps of:

(a) immersing a woven glass fiber fabric in an epoxy resin composition comprising;

a brominated epoxy resin prepared as the reaction product of tetrabromo bisphenol A an epichlorhydrin and having a functionality of about 1.7 to about 2, an epoxide equivalent of about 455 to about 500 and a bromine content of about 19% to about 23% by weight of the resin, said brominated epoxy resin being present in the amount about 70 to 90 parts per hundred by weight of resin solids;

a tetrafunctional epoxy resin prepared as the reaction product of tetra bis (hydroxyphenyl) ethane and epichlorhydrin, and having an average functionality of about 4, an epoxide equivalent weight of about 210 to about 240, and is present in the amount of about 10 to about 30 parts per hundred by weight of resin solids;

dicyandiamide as a curing agent and being present in the amount of about 3 to 4 parts per hundred by weight of resin solids.

a tertiary amine as a catalyst in the amount of about 0.2 to about 0.4 part per hundred by weight of resin solids, and a suitable solvent (b) passing the epoxy impregnated glass fabric through an oven having a succession of temperature gradients ranging from 250 to 350° F. to successively remove said solvents and to partially cure said resin to a desired state.

4. The process of claim 3 wherein said composition is comprised of 10 parts per hundred by weight of said polyglycidyl ether of tetraphenylene ethane, 90 parts per hundred by weight of said diglycidyl ether of tetrabromo bisphenol A, 4 parts per hundred by weight of dicyandiamide as said curing agent, 0.2 to 0.4 part per hundred by weight of N,N,N',N,-tetramethyl-1,3-butane diamine dissolved in 40 parts by weight of ethylene glycol monomethyl ether and methyl ethyl ketone in amounts sufficient to adjust said composition to a specific gravity of 1.085±0.005 s.g.

5. As an article of manufacture, a glass fabric impregnated with an epoxy resin composition comprising:

a diglycidyl ether of tetrabromo bisphenol A having an epoxide equivalent weight of from 455 to 500, a functionality of from 1.7 to 2, and a bromine content of from 19 to 23% by weight and a high functionality polyglycidyl ether of tetraphenylene ethane having an epoxide equivalent weight of from 210 to 240 and a functionality greater than 4 wherein said high functionality polyglycidyl ether of tetraphenylene ethane is present in from 10 to 30 parts per hundred parts by weight of the resin content of said article, said composition containing dicyandiamide as a curing agent and being present in the amount of about 3 to about 4 parts per hundred by weight of resin solids; a tertiary amine as a catalyst in the amount of about 0.2 to about 0.4 part per hundred by weight of resin solids.

References Cited

UNITED STATES PATENTS

| | | | |
|---|---|---|---|
| 3,058,946 | 10/1962 | Nametz | 260—830 |
| 3,438,937 | 4/1969 | Christie | 260—47 |
| 3,452,116 | 6/1969 | Schwarzer | 260—830 |

PAUL LIEBERMAN, Primary Examiner

U.S. Cl. X.R.

117—126, 161; 260—47, 328, 332, 830